United States Patent
Rai et al.

(10) Patent No.: US 9,622,377 B2
(45) Date of Patent: Apr. 11, 2017

(54) COLD PLATE HAVING SEPARABLE FLOW DIRECTING BAFFLE

(71) Applicant: Lear Corporation, Southfield, MI (US)

(72) Inventors: Rutunj Rai, Canton, MI (US); Parminder Brar, Windsor (CA); Michael Scott Duco, Fraser, MI (US); Jared Pieknik, Westland, MI (US)

(73) Assignee: Lear Corporation, Southfield, MI (US)

( * ) Notice: Subject to any disclaimer, the term of this patent is extended or adjusted under 35 U.S.C. 154(b) by 249 days.

(21) Appl. No.: 14/657,603

(22) Filed: Mar. 13, 2015

(65) Prior Publication Data

US 2016/0270258 A1    Sep. 15, 2016

(51) Int. Cl.
*F28F 3/12* (2006.01)
*H05K 7/20* (2006.01)

(52) U.S. Cl.
CPC .............................. *H05K 7/20254* (2013.01)

(58) Field of Classification Search
CPC ..... H05K 7/20254; F28D 9/0081; F28D 1/06; F28D 1/0308; F28D 1/0366; F28D 9/0031; F28D 9/0062; F28F 3/12; F28F 3/14; H01L 23/473
USPC ........................................ 165/168, 169, 170
See application file for complete search history.

(56) References Cited

U.S. PATENT DOCUMENTS

| | | | |
|---|---|---|---|
| 5,239,200 A * | 8/1993 | Messina | H01L 23/473 165/104.33 |
| 5,841,634 A * | 11/1998 | Visser | F28F 3/12 165/104.33 |
| 6,305,463 B1 * | 10/2001 | Salmonson | G06F 1/20 165/185 |
| 8,902,582 B2 | 12/2014 | Yalamanchili et al. | |
| 2001/0035285 A1 * | 11/2001 | Ognibene | F28F 3/02 165/167 |
| 2005/0103472 A1 * | 5/2005 | Lofland | F28F 3/12 165/80.4 |
| 2005/0199372 A1 | 9/2005 | Frazer et al. | |
| 2006/0096738 A1 * | 5/2006 | Kang | F28F 3/022 165/80.4 |
| 2012/0175094 A1 | 7/2012 | Rice | |
| 2013/0034767 A1 | 2/2013 | Pentapati et al. | |
| 2013/0258596 A1 | 10/2013 | Sharaf et al. | |

(Continued)

FOREIGN PATENT DOCUMENTS

CN     202816913 U     3/2013
CN     203896658 U     10/2014

(Continued)

OTHER PUBLICATIONS

Intellectual Property Office, Combined Search and Examination Report Under Sections 17 and 18(3) for corresponding Great Britain Patent Application No. GB1518055.7 dated Apr. 19, 2016.

*Primary Examiner* — Justin Jonaitis
(74) *Attorney, Agent, or Firm* — Brooks Kushman P.C.

(57) ABSTRACT

An assembly includes a cold plate enclosure and a flow directing baffle separable from the cold plate enclosure. The cold plate enclosure includes a cavity therein, an inlet for coolant ingress into the cavity, and an outlet for coolant egress out of the cavity. The baffle is attached to the enclosure within the cavity. The baffle includes flow directing features such that the baffle directs coolant flow through the cavity from the inlet to the outlet in a prescribed manner.

16 Claims, 4 Drawing Sheets

(56) References Cited

U.S. PATENT DOCUMENTS

2013/0312931 A1   11/2013  Sharaf et al.
2013/0312933 A1   11/2013  Sharaf
2016/0322280 A1*  11/2016  Schmit .................. H01L 23/473

FOREIGN PATENT DOCUMENTS

| EP | 2575418 A1 | 4/2013 |
| EP | 2965850 A1 | 1/2016 |
| WO | 2005040709 A1 | 5/2005 |
| WO | 2012138833 A2 | 10/2012 |
| WO | 2014139826 A1 | 9/2014 |

\* cited by examiner

COLD PLATE HAVING SEPARABLE FLOW DIRECTING BAFFLE

TECHNICAL FIELD

The present invention relates to a cold plate having features for directing coolant through the cold plate.

BACKGROUND

Cold plates are used for cooling electronics, such as electric or hybrid vehicle battery chargers. Such battery chargers convert AC power from the grid into DC power for charging the vehicle batteries. A battery charger includes electronic components which operate to convert the AC power into DC power. The electronic components generate heat while operating. A cold plate attached to the battery charger housing dissipates the heat.

SUMMARY

An assembly includes a cold plate enclosure and a flow directing baffle separable from the cold plate enclosure. The cold plate enclosure includes a cavity therein, an inlet for coolant ingress into the cavity, and an outlet for coolant egress out of the cavity. The baffle is attached to the enclosure within the cavity. The baffle includes flow directing features such that the baffle directs coolant flow through the cavity from the inlet to the outlet in a prescribed manner.

A method for making a cold plate assembly includes casting a cold plate enclosure having a cavity therein, an inlet for coolant ingress into the cavity, and an outlet for coolant egress out of the cavity. The method further includes forming a non-cast baffle separable from the enclosure for attachment to the enclosure within the cavity, the baffle including flow directing features such that when attached to the enclosure within the cavity the baffle directs coolant flow through the cavity from the inlet to the outlet in a prescribed manner.

The cold plate enclosure may be of metal and the baffle may be of non-metal. For instance, the cold plate enclosure may be of aluminum and the baffle may be of plastic. In general, the cold plate enclosure is of cast components and the baffle is a non-cast component. For instance, the baffle is an injection molded component.

The baffle may further include flow metering features and flow blocking features such that the baffle directs coolant flow through the cavity from the inlet to the outlet in the prescribed manner. The flow directing features of the baffle may include one or more of flow blocking legs, flow blocking barriers, flow ramps, flow bridges flow troughs, and flow funnels.

The cold plate enclosure may include a cover and a base attached to one another with the cavity being between the cover and the base. In this case, the cavity is between an interior surface of the base and an interior surface of the cover, and the baffle is attached to the interior surface of the base at a designated location such that the baffle directs coolant flow through the cavity from the inlet to the outlet in the prescribed manner. At least one of an exterior surface of the base and an exterior surface of the cover is configured to receive an electronic assembly housing thereon.

DETAILED DESCRIPTION

Detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Figures 1, 2A:
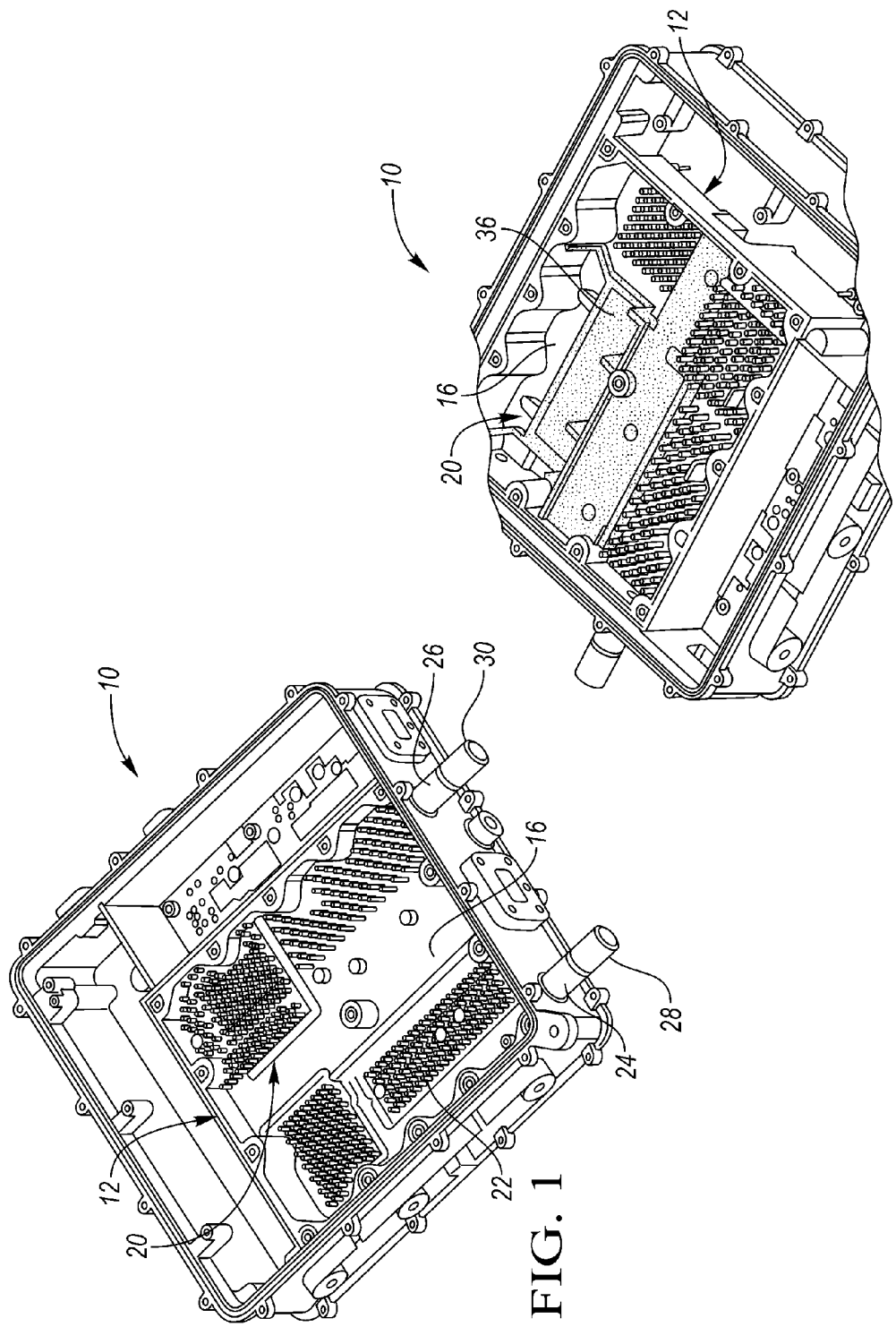
FIG. 1 illustrates the base of the cold plate at a view looking into the base with the cover of the cold plate for the base being removed from the base.
FIG. 2A illustrates the base including a separable flow directing baffle at a view looking into the base with the cover being removed from the base.

Referring now to FIG. 1, a base 12 of a cold plate 10 is shown. Base 12 is an enclosure lacking a ceiling. Cold plate 10 further includes a cover 14 (shown in FIGS. 3 and 4A) for base 12. Cover 14 attached to base 12 provides a ceiling for the base and thereby completes the enclosure. Cold plate 10 is assembled as a fully enclosed enclosure when base 12 and cover 14 are attached.

In the assembled cold plate 10 with base 12 and cover 14 attached to one another, interior surface 16 of base 12 and interior surface 18 of cover 14 face one another. Cold plate 10 includes a cavity or manifold 20 within the enclosure. Cavity 20 is defined or formed between interior surface 16 of base 12 and interior surface 18 of cover 14. Coolant of any type known in the art may be circulated into and out of cavity 20. As such, cold plate 10 is a coolant-cooled heat sink.

Cold plate 10 extracts, removes, dissipates, etc. ("dissipates") heat generated by an electronic assembly housed in a housing(s) (not shown) attached to exterior surface 32 of base 12 and/or exterior surface 34 of cover 14. For instance, the electronic assembly is an electric or hybrid vehicle battery charger for converting AC power from the grid into DC power for charging the vehicle batteries. Such a battery charger includes various electronic components which operate to convert the AC power into DC power. The electronic components generate a relatively large amount of heat while operating as, for instance, the battery charger is a 3.3 to 3.6 kW battery charger. The electronic components of the battery charger may be housed in one or more housings attached to exterior surface 32 of base 12 and/or exterior surface 34 of cover 14. This will be collectively referred to as the electronic assembly attached to an exterior surface of base 12 or cover 14. The electronic assembly is attached to an exterior surface of base 12 or cover 14 for cold plate 10 to dissipate the heat generated by the electronic assembly.

Cold plate 10 acts as and may also be referred to as a heat extractor or heat sink. Cold plate 10 dissipates heat from an electronic assembly attached to an exterior surface of base 12 or cover 14 by absorbing heat from the electronic assembly into the base and the cover. The absorbed heat radiates out from the base and the cover into the coolant within cavity 20. The heated coolant is circulated out of cavity 20.

Base 12 and cover 14 are cast metal components having relatively high thermal conduction capabilities. For instance, base 12 and cover 14 are manufactured from aluminum. Heat generated from an electronic assembly attached to exterior surfaces 32 and 34 of base 12 and cover 14 conducts into the exterior surfaces and then into interior surfaces 16 and 18 of the base and the cover. The heat radiates from interior surfaces 16 and 18 of base 12 and cover 14 into cavity 20. Coolant within cavity 20 absorbs the heat radiated into the cavity and heats up. The heated coolant is expelled from cavity 20 and replaced with cooled coolant injected into the cavity. The cooled coolant within cavity 20 is heated up with more heat originating from the electronic assembly as the process continues.

The view of FIG. 1 looks into base 12 with cover 14 being removed from the base. Interior surface 16 of base 12 is therefore shown in FIG. 1. Interior surface 16 of base 12 includes various features thereon such as fins or protuberances 22. Protuberances 22 project from interior surface 16 of base 12 into cavity 20. Protuberances 22 function to increase the heat conduction surface area of interior surface 16 of base 12. As such, heat absorbed into interior surface 16 of base 12 radiates more efficiently from interior surface 16 of base 12 into cavity 20. Interior surface 18 of cover 14 may likewise include such protuberances.

As shown in FIG. 1, protuberances 22 are arranged in groups on respective areas of interior surface 16 of base 12. Protuberances 22 are arranged in this manner as each group of protuberances 22 corresponds to a respective electronic assembly. In particular, a group of protuberances on an area of interior surface 16 of base 12 is to radiate heat generated by an electronic assembly attached to exterior surface 32 of base 12 opposed from that area of interior surface 16 of base 12.

Coolant circulates into and out of cavity 20 to absorb the heat within the cavity and to dissipate the heat out of the cavity and away from cold plate 10. Base 12 includes a pair of ports 24 and 26 for coolant to enter into and exit out of cavity 20. For instance, port 24 is an inlet port and port 26 is an outlet port. Pressurized coolant is injected into inlet port 24 and circulates through cavity 20 to outlet port 26 and discharges out of the outlet port. Inlet port 24 and outlet port 26 may be configured for attachment to inlet/outlet fittings 28, 30 for that purpose.

Cavity 20 requires sufficient coolant flow through the entire cavity for heat to be efficiently absorbed from all parts of the cavity. A concern is that the flow of coolant may be less than optimal due to the configuration of cavity 20 as defined by interior surface 16 of base 12 and interior surface 20 of cover 14. Coolant takes the path of least resistance through cavity 20 in getting from inlet port 24 to outlet port 26. Accordingly, unless cavity 20 is designed with appropriate flow directing features, undesired turbulent coolant flow, stagnation of coolant in certain parts within cavity 20, insufficient amount of flow or volume of coolant in certain parts within cavity, or other undesirable conditions may occur. Such factors cause cold plate 10 to not have optimal heat dissipation performance.

Figure 2B:
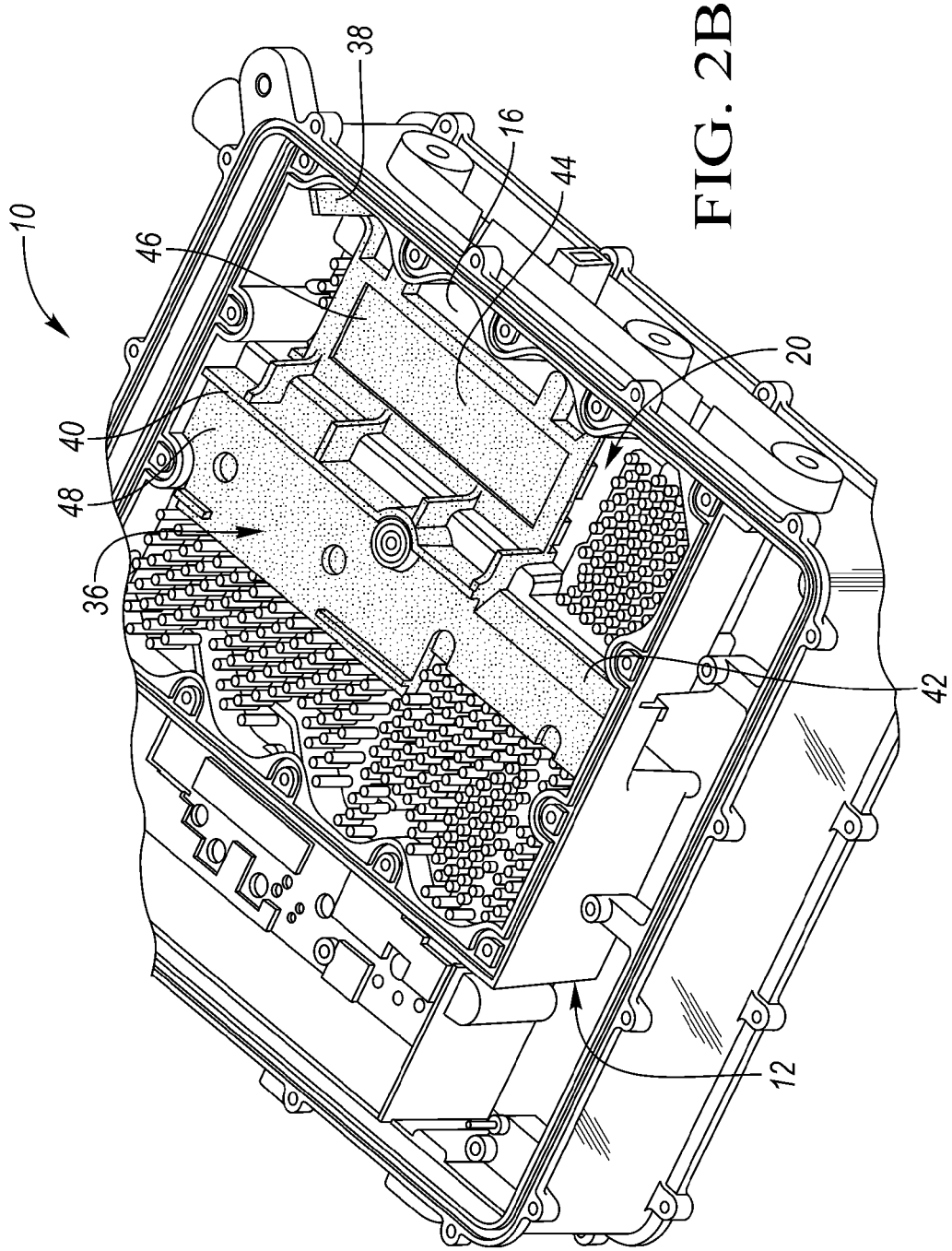
FIG. 2B illustrates the base including the baffle at another view looking into the base with the cover being removed from the base.

Referring now to FIGS. 2A and 2B, with continual reference to FIG. 1, base 12 including a separable flow directing baffle (or spacer) 36 is shown. Like the view of FIG. 1, the two views of FIGS. 2A and 2B look into base 12 with cover 14 removed from the base.

Baffle 36 functions to direct coolant flow within cavity 20. Baffle 36 directs the coolant flow within cavity 20 such that coolant flows through the cavity in an optimal pattern whereby cold plate 10 has optimal heat dissipation performance. For instance, baffle 36 is configured to direct the coolant flow such that sufficient coolant flow occurs through the entire cavity 20 for heat to be efficiently absorbed from all parts of the cavity. In this way, baffle 36 minimizes or eliminates undesired turbulent coolant flow, coolant stagnation, and insufficient coolant flow or volume within cavity 20. Such characteristics may be associated with a cold plate lacking the appropriate flow directing features, which are provided by baffle 36, as described above. One way that baffle 36 improves coolant flow characteristics, and therefore cooling, of cold plate 10 is by blocking "short circuits" that would allow coolant to avoid flowing through protuberances 22 by flowing through lower-flow-resistance paths between inlet 28 and outlet 30. Baffle 36 can also affirmatively direct flow through protuberances 22 via baffle 36's various flow directing features described herein.

Baffle 36 has a predetermined configuration that is tuned to interact with interior surface 16 of cover 12 (and interior surface 18 of base 14) to cause the coolant to flow in a desirable manner from inlet port 24 through cavity 20 to outlet port 26. Baffle 36 may include various flow directing, flow metering, and flow blocking features which function to cause the coolant to flow in the desirable manner through cavity 20. For instance, baffle 36 includes one or more flow blocking legs 38, flow blocking barrier 40, flow ramp 42, flow bridge 44, flow trough 46, and flow funnel 48. As baffle 36 is configured to provide efficient coolant flow through cavity 20, interior surface 16 of cover 12 (and interior surface 18 of base 14) may be able to be designed differently in a more optimal way. For instance, because of the presence of baffle 36 directing efficient coolant flow through cavity 20, the projection height of protuberances 22 from interior surface 16 of base 12 into the cavity may be reduced.

Baffle 36 attaches to interior surface 16 of base 12 to be in a designated position at which the baffle directs coolant flow in the desirable manner. For instance, baffle 36 attaches to features of interior surface 16 of cover 12 such as fins or locating bosses. The configuration and designated position of baffle 36 (in conjunction with the configuration of interior surface 16 of base 12 and interior surface 18 of cover 14) define the manner in which baffle 36 directs coolant flow. Baffle 36 is pre-designed based on these variables to provide the desired coolant flow through cavity 20. In other embodiments, a baffle like baffle 36 attaches to interior surface 18 of cover 14 for directing coolant flow.

Baffle 36 is a separate element from base 12 and cover 14. Although baffle 36 attaches to interior surface 16 of base 12, the baffle is "separable" (i.e., able to be separated or treated separately) from base 12. As baffle 36 is separable, the baffle is not cast with base 12 and the baffle may be manufactured from a different material than the metal of base 12. For instance, baffle 36 is manufactured from a non-metal component such as plastic. In this case, cold plate 10 includes base 12 and cover 14 which are cast from aluminum and baffle 36 separately formed from plastic.

As base 12 and cover 14 are cast from metal whereas baffle 36 may be made from plastic, baffle 36 can be manufactured more easily than base 12 and cover 14. Design changes in the configuration or layout of baffle 36 can be conducted easily as the baffle is made of plastic as opposed to metal. That is, the plastic flow directing baffle 36 can be made much easier than making base 12 with coolant flow directing features cast on interior surface 16 of base 12 thereon.

Because baffle 36 is a separable component, differently designed baffles may be interchanged with interior surface 16 of base 12. In this way, appropriately designed baffles can be identified through trial and error and subsequent improved baffle designs can be readily implemented into cavity 20. In this way, design flexibility is enhanced as compared to casting base 12 with coolant flow directing features cast onto interior surface 16 of the base.

The weight and material thickness of cold plate 10 is reduced with plastic baffle 36 as compared to a cold plate having cast flow directing features.

In sum, (plastic) baffle 36 results in less weight for cold plate 10, less complexity in the die cast parts of the cold plate, and ease of manufacturing the cold plate. Coolant flow can be directed where desired using baffle 36 without increasing complexity of the metal (aluminum) parts of cold plate 10. A complex shape of baffle 36 is possible as it can be made via an injection mold process.

Figure 3:
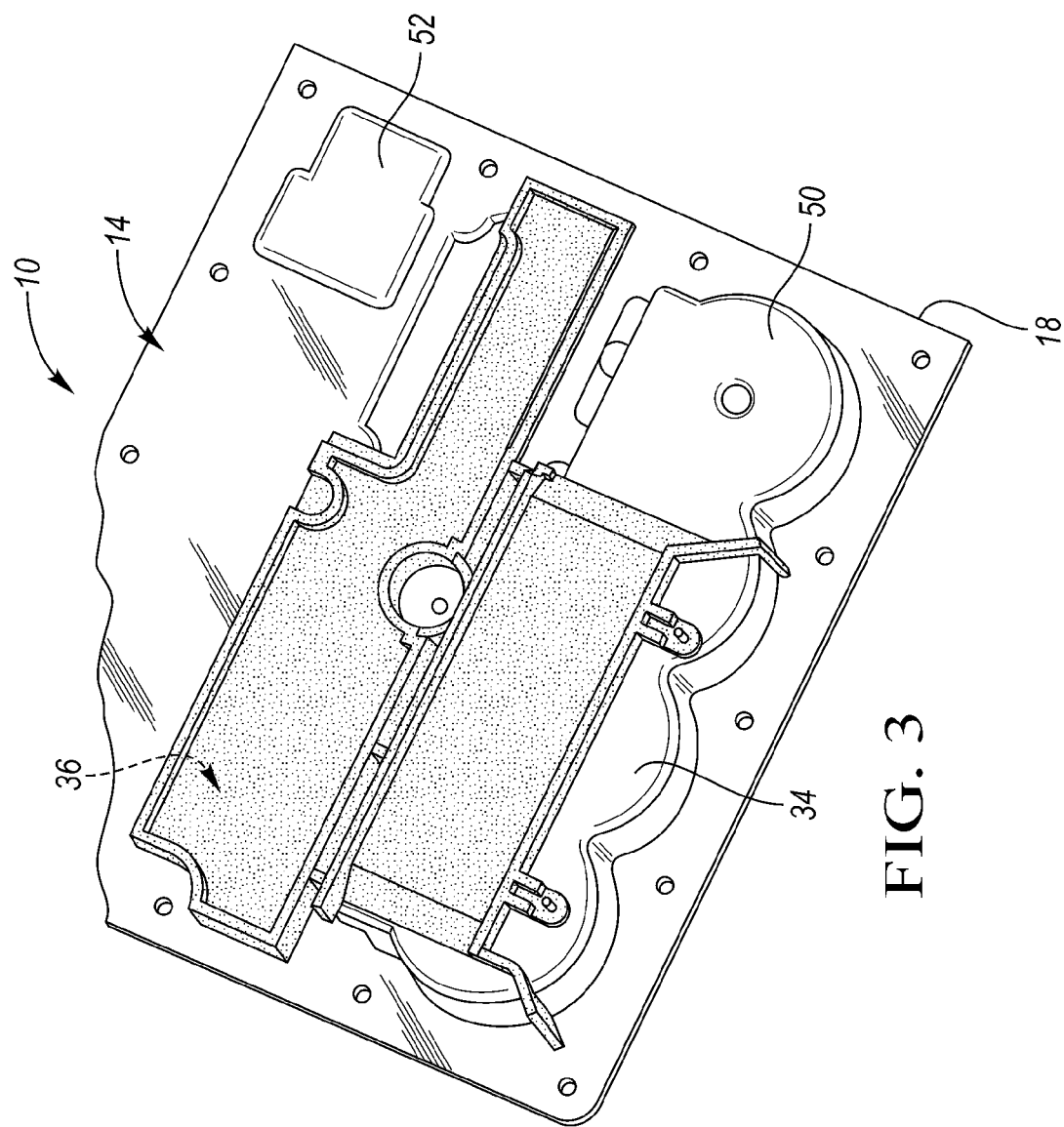
FIG. 3 illustrates the cover and the baffle at a view looking from the base towards the cover.

Referring now to FIG. 3, with continual reference to FIGS. 1, 2A, and 2B, cover 14 and baffle 36 are shown. The view of FIG. 3 looks down toward exterior surface 34 of cover 14 with baffle 36 underneath interior surface 18 of cover 14 being shown in an outline form. As shown in FIG. 3, exterior surface 34 of cover 14 includes indented portions such as indented portions 50 and 52. Indented portions 50 and 52 provide respective areas for the housings of an electronic assembly to be attached to exterior surface 34 of cover 14. In this way, heat from the electronic assembly is transferred to the indented portions 50 and 52 of exterior surface 34 of cover 14 into cavity 20.

Figure 4B:
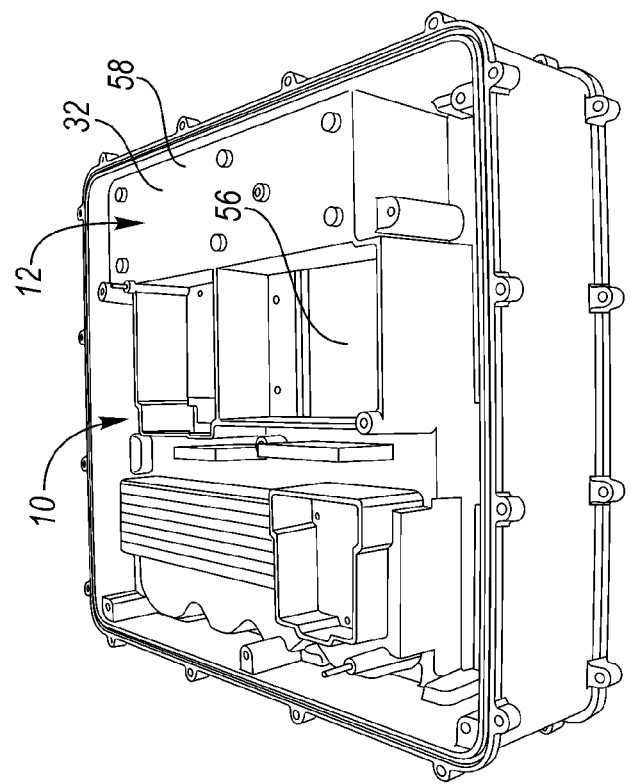
FIG. 4B illustrates the assembled cold plate at a view looking toward the exterior surface of the base.
Figure 4A:
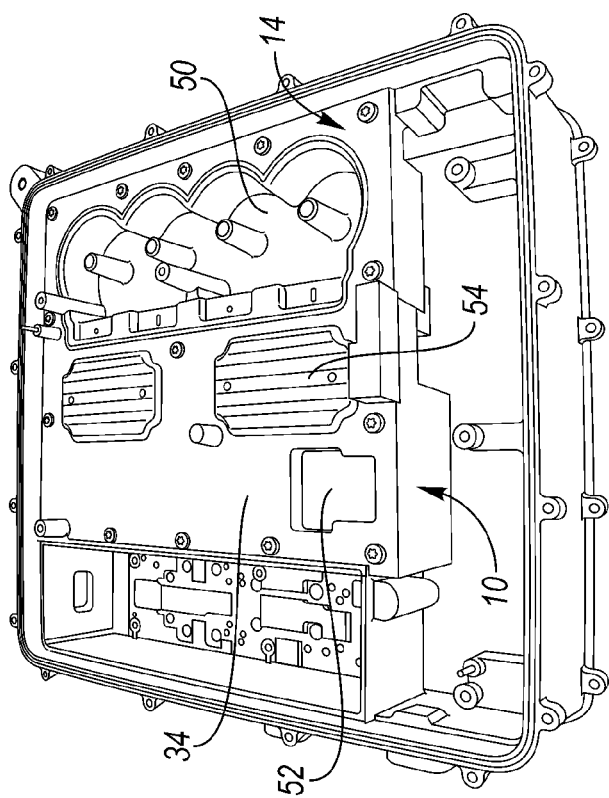
FIG. 4A illustrates the assembled cold plate at a view looking toward the exterior surface of the cover.

FIG. 4A illustrates the assembled cold plate 10 at a view looking toward exterior surface 34 of cover 14. As shown, exterior surface 34 of cover 14 further includes pads 54. Pads 54 are configured to receive housings of the electronic assembly to be mounted thereon.

FIG. 4B illustrates the assembled cold plate at a view looking toward exterior surface 32 of base 12. Like exterior surface 34 of cover 14, exterior surface 32 of base 12 includes indented portions 56 and a pad 58 for receiving housings of the electronic assembly. In this way, heat from these housings of the electronic assembly is transferred to exterior surface 32 of base 12 and into cavity 20.

While exemplary embodiments are described above, it is not intended that these embodiments describe all possible forms of the present invention. Rather, the words used in the specification are words of description rather than limitation, and it is understood that various changes may be made without departing from the spirit and scope of the present invention. Additionally, the features of various implementing embodiments may be combined to form further embodiments of the present invention.

What is claimed is:

1. An assembly comprising:
    a cold plate enclosure having a cavity therein, an inlet for coolant ingress into the cavity, and an outlet for coolant egress out of the cavity; and
    a baffle separable from the cold plate enclosure and attached to the cold plate enclosure within the cavity, the baffle including different types of flow directing features at respective positions of the baffle in an uneven pattern with (i) a first set of the flow directing features of a first set of types to direct coolant flow through the cavity and (ii) a second set of the flow directing features of a second set of types different than the first set of types to direct coolant flow through the cavity such that the baffle directs at least (i) a first portion of the coolant flow from the inlet to the outlet encountering flow directing features of the first set of types and (ii) a second portion of the coolant flow from the inlet to the outlet encountering flow directing features of the second set of types such that the baffle directs coolant flow through the cavity from the inlet to the outlet in a prescribed manner,
    the different types of flow directing features of the baffle include one or more flow ramps, flow bridges, and flow funnels.

2. The assembly of claim 1 wherein:
    the cold plate enclosure is of metal and the baffle is of non-metal.

3. The assembly of claim 2 wherein:
    the baffle is of plastic.

4. The assembly of claim 1 wherein:
    the cold plate enclosure is of cast components and the baffle is a non-cast component.

5. The assembly of claim 4 wherein:
    the baffle is an injection molded component.

6. The assembly of claim 1 wherein:
    the baffle includes additional flow directing features which are flow blocking barriers, flow blocking legs, and flow troughs.

7. The assembly of claim 1 wherein:
    the cold plate enclosure includes a cover and a base attached to one another with the cavity being between the cover and the base.

8. The assembly of claim 7 wherein:
    the cavity is between an interior surface of the base and an interior surface of the cover, and the baffle is attached to the interior surface of the base at a designated location such that the baffle directs coolant flow through the cavity from the inlet to the outlet in the prescribed manner.

9. The assembly of claim 8 wherein:
    the interior surface of the base includes cast flow direction features thereon, and the baffle cooperates with the cast flow direction features on the interior surface of the base such that the baffle directs coolant flow through the cavity from the inlet to the outlet in the prescribed manner.

10. The assembly of claim 8 wherein:
    at least one of an exterior surface of the base and an exterior surface of the cover is configured to receive an electronic assembly housing thereon.

11. A method for making a cold plate assembly, the method comprising:
    casting a cold plate enclosure having a cavity therein, an inlet for coolant ingress into the cavity, and an outlet for coolant egress out of the cavity; and
    forming a non-cast baffle separable from the cold plate enclosure for attachment to the cold plate enclosure within the cavity, the baffle including different types of flow directing features at respective positions of the baffle in an uneven pattern with (i) a first set of the flow directing features of a first set of types to direct coolant flow through the cavity and (ii) a second set of the flow directing features of a second set of types different than the first set of types to direct coolant flow through the such that when attached to the enclosure within the cavity the baffle directs at least (i) a first portion of the coolant flow from the inlet to the outlet encountering flow directing features of the first set of types and (ii) a second portion of the coolant flow from the inlet to the outlet encountering flow directing features of the second set of types such that the baffle directs coolant flow through the cavity from the inlet to the outlet in a prescribed manner, the different types of flow directing features of the baffle include one or more flow ramps, flow bridges, and flow funnels.

12. The method of claim 11 wherein:

the cold plate enclosure is of metal and the baffle is of non-metal.

13. The method of claim 12 wherein:

the baffle is of plastic.

14. The method of claim 11 wherein:

the cold plate enclosure is of cast components and the baffle is a non-cast component.

15. The method of claim 14 wherein:

the baffle is an injection molded component.

16. The method of claim 11 wherein:

the baffle includes additional flow directing features which are flow blocking barriers, flow blocking legs, and flow troughs.

\* \* \* \* \*